US011439021B2

(12) United States Patent
Jeong et al.

(10) Patent No.: US 11,439,021 B2
(45) Date of Patent: Sep. 6, 2022

(54) ELECTRONIC COMPONENT-EMBEDDED SUBSTRATE

(71) Applicant: SAMSUNG ELECTRO-MECHANICS CO., LTD., Suwon-si (KR)

(72) Inventors: Koo Woong Jeong, Suwon-si (KR); Kyung Hwan Ko, Suwon-si (KR); Jung Hyun Cho, Suwon-si (KR); Chang Soo Woo, Suwon-si (KR); Soon Cheol Jung, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/095,123

(22) Filed: Nov. 11, 2020

(65) Prior Publication Data
US 2022/0007511 A1 Jan. 6, 2022

(30) Foreign Application Priority Data
Jul. 6, 2020 (KR) .................. 10-2020-0082795

(51) Int. Cl.
H05K 1/18 (2006.01)
H05K 1/11 (2006.01)
(Continued)

(52) U.S. Cl.
CPC ......... *H05K 1/186* (2013.01); *H01L 23/3121* (2013.01); *H01L 23/49822* (2013.01);
(Continued)

(58) Field of Classification Search
CPC .... H05K 1/11; H05K 1/111–113; H05K 1/18; H05K 1/181–187; H05K 23/3121;
(Continued)

(56) References Cited

U.S. PATENT DOCUMENTS 7,321,164 B2 * 1/2008 Hsu .................. H01L 23/5389
257/685
7,781,877 B2 * 8/2010 Jiang ................ H01L 21/76877
257/686

(Continued)

FOREIGN PATENT DOCUMENTS

KR 10-1155624 B1 6/2012
KR 10-1175901 B1 8/2012
(Continued)

*Primary Examiner* — Tuan T Dinh
(74) *Attorney, Agent, or Firm* — Morgan, Lewis & Bockius LLP

(57) ABSTRACT

An electronic component-embedded substrate includes a first core layer having a first through-hole, a first passive component disposed in the first through-hole, a second core layer disposed on the first core layer and having a second through-hole, a second passive component disposed in the second through-hole, an insulating material covering at least a portion of each of the first passive component and the second passive component and disposed in at least a portion of each of the first through-hole and the second through-hole, and a first wiring layer disposed on a level between the first passive component and the second passive component such that at least a portion of the first wiring layer is covered with the insulating material. The first passive component and the second passive component are connected to each other by the first wiring layer.

22 Claims, 13 Drawing Sheets

(51) Int. Cl.
*H01L 23/31* (2006.01)
*H01L 23/498* (2006.01)
*H01L 23/538* (2006.01)
*H01L 25/18* (2006.01)

(52) U.S. Cl.
CPC .......... *H01L 23/5389* (2013.01); *H05K 1/113* (2013.01); *H01L 25/18* (2013.01); *H05K 2201/09063* (2013.01); *H05K 2201/1003* (2013.01); *H05K 2201/10015* (2013.01); *H05K 2201/10022* (2013.01)

(58) Field of Classification Search
CPC ......... H05K 23/5389; H05K 23/48922; H05K 2201/1003; H05K 2201/10015; H05K 2201/10022; H05K 2201/09063; H01L 23/3121; H01L 23/5389; H01L 23/48922
USPC ................. 361/764–784, 790–795, 803; 174/258–264; 257/685–730

See application file for complete search history.

(56) References Cited

U.S. PATENT DOCUMENTS

| | | | | |
|---|---|---|---|---|
| 9,560,770 | B2* | 1/2017 | Munakata | H05K 3/32 |
| 9,743,526 | B1* | 8/2017 | Blackshear | H05K 3/4623 |
| 10,881,004 | B1 | 12/2020 | Lee et al. | |
| 11,129,280 | B2* | 9/2021 | Lee | H05K 1/115 |
| 2007/0018313 | A1* | 1/2007 | Gomyo | H01L 21/568 |
| | | | | 257/723 |
| 2008/0196931 | A1* | 8/2008 | Lee | H01L 24/82 |
| | | | | 174/260 |
| 2009/0316373 | A1* | 12/2009 | Kim | H01L 23/5389 |
| | | | | 361/764 |
| 2010/0149768 | A1* | 6/2010 | Takaike | H01L 23/5383 |
| | | | | 361/761 |
| 2016/0066417 | A1* | 3/2016 | Sugiyama | H05K 3/4641 |
| | | | | 361/760 |
| 2020/0058569 | A1 | 2/2020 | Cho et al. | |
| 2021/0185822 | A1 | 6/2021 | Lee et al. | |

FOREIGN PATENT DOCUMENTS

| | | |
|---|---|---|
| KR | 10-2020-0020563 A | 2/2020 |
| KR | 10-2021-0076582 A | 6/2021 |
| KR | 10-2021-0076584 A | 6/2021 |

* cited by examiner

ELECTRONIC COMPONENT-EMBEDDED SUBSTRATE

CROSS-REFERENCE TO RELATED APPLICATION(S)

The present application claims the benefit of priority to Korean Patent Application No. 10-2020-0082795, filed on Jul. 6, 2020 in the Korean Intellectual Property Office, the entire disclosure of which is incorporated herein by reference.

TECHNICAL FIELD

The present disclosure relates to an electronic component-embedded substrate.

BACKGROUND

Recently, high-performance packages have been required with the technology developments of fifth-generation (5G) mobile communications, artificial intelligence (AI), and the like. Accordingly, improved electrical characteristics such as signal integrity (SI), power integrity (PI), and the like, have been required, and the number of passive components, which should be mounted on a substrate in a package, has increased.

SUMMARY

According to an aspect of the present disclosure, an electronic component-embedded substrate includes a first core layer having a first through-hole, a first passive component disposed in the first through-hole, a second core layer disposed on the first core layer and having a second through-hole, a second passive component disposed in the second through-hole, an insulating material covering at least a portion of each of the first passive component and the second passive component and disposed in at least a portion of each of the first through-hole and the second through-hole, and a first wiring layer disposed on a level between the first passive component and the second passive component such that at least a portion of the first wiring layer is covered with the insulating material. The first passive component and the second passive component are connected to each other by the first wiring layer.

According to an aspect of the present disclosure, an electronic component-embedded substrate includes a core structure including a first core layer having a first through-hole, a first passive component disposed in the first through-hole, a second core layer disposed on the first core layer and having a second through-hole, a second passive component disposed in the second through-hole, and an insulating material covering each of the first passive component and the second component and disposed in at least a portion of each of the first through-hole and the second through-hole, a first build-up structure including a first insulating layer and a first wiring layer connected to the first passive component, the first core layer disposed between the first build-up structure and the second core layer, and a second build-up structure including a second insulating layer and a second wiring layer connected to the second passive component, the second core layer disposed between the second build-up structure and the second core layer. The insulating material integrally covers a side surface of the second passive component and a surface of the second passive component facing the second build-up structure.

According to an aspect of the present disclosure, an electronic component-embedded substrate includes a first core layer having a first through-hole, a first passive component disposed in the first through-hole, a second core layer disposed on the first core layer and having a second through-hole, a second passive component disposed in the second through-hole, an insulating material covering at least a portion of each of the first passive component and the second passive component and disposed in at least a portion of each of the first through-hole and the second through-hole, and a conductive structure embedded in the insulating material and disposed between the first passive component and the second passive component. The first passive component and the second passive component are connected to each other by the conductive structure.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Figure 1:
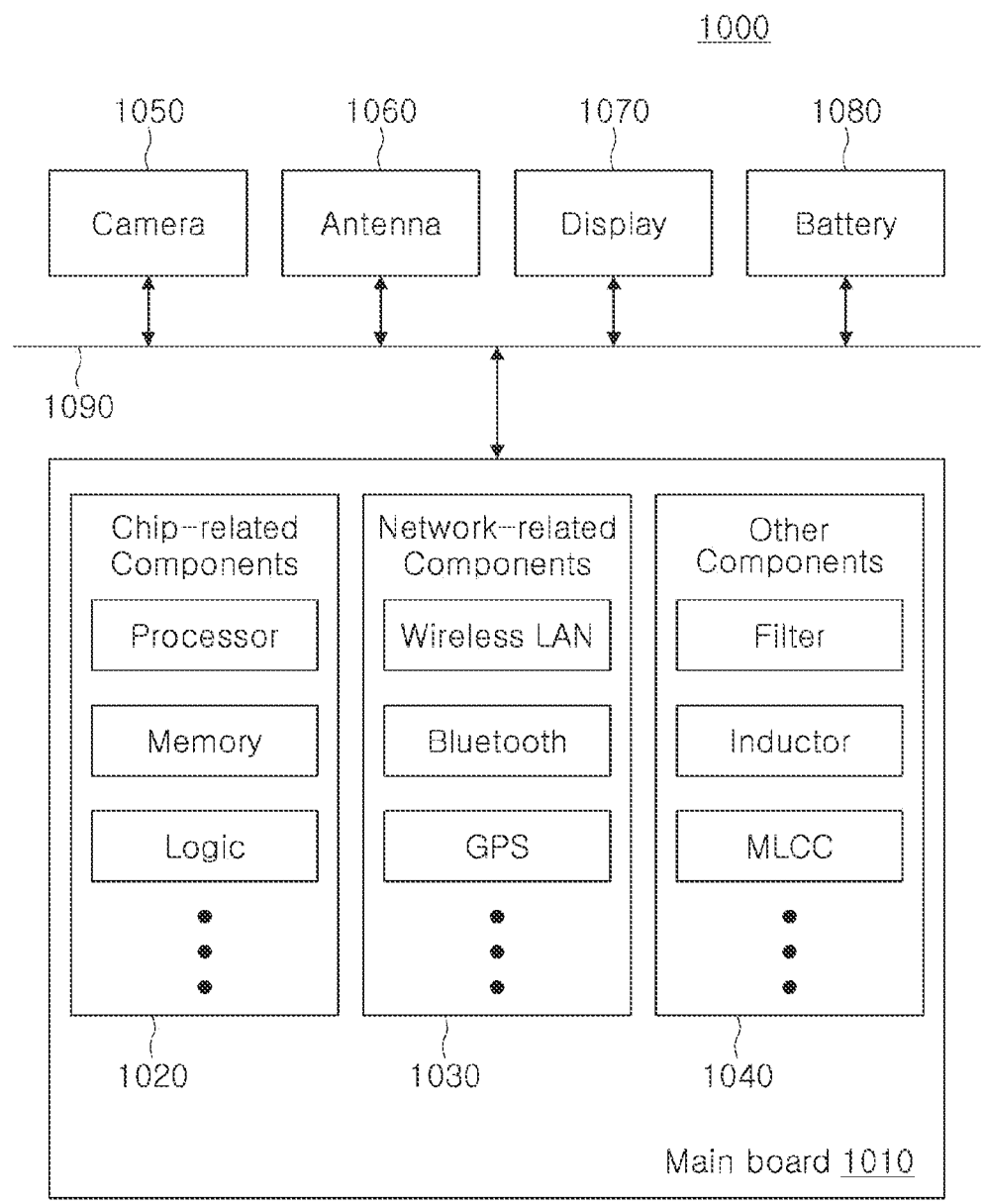
FIG. 1 is a schematic block diagram of an electronic device system according to an exemplary embodiment of the present disclosure.

Hereinafter, the present disclosure will be described with reference to the accompanying drawings. Shapes and sizes of the elements in the drawings may be exaggerated or reduced for clarity of description.

Electronic Device

FIG. 1 is a schematic block diagram of an electronic device system according to an exemplary embodiment.

Referring to FIG. 1, an electronic device 1000 may accommodate a mainboard 1010 therein. The mainboard 1010 may include chip-related components 1020, network-related components 1030, other components 1040, and the like, physically and/or electrically connected thereto. These components may be connected to other components to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like. However, the chip-related components 1020 are not limited thereto, and may also include other types of chip related components. In addition, the chip-related components 1020 may be combined with each other. The chip-related component 1020 may be in the form of a package including the above-described chip or an electronic component.

The network-related components 1030 may include protocols such as wireless fidelity (Wi-Fi) (Institute of Electrical and Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network-related components 1030 are not limited thereto, but may also include a variety of other wireless or wired standards or protocols. In addition, the network-related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip-related components 1020 and/or the network-related components 1030 described above.

Depending on a type of the electronic device 1000, the electronic device 1000 may include other components that may or may not be physically and/or electrically connected to the mainboard 1010. These other components may include, for example, a camera module 1050, an antenna module 1060, a display device 1070, a battery 1080, or the like. However, these other components are not limited thereto, but may also include an audio codec, a video codec, a power amplifier, a compass, an accelerometer, a gyroscope, a speaker, amass storage unit (for example, a hard disk drive), a compact disk (CD) drive, a digital versatile disk (DVD) drive, or the like. These other components may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
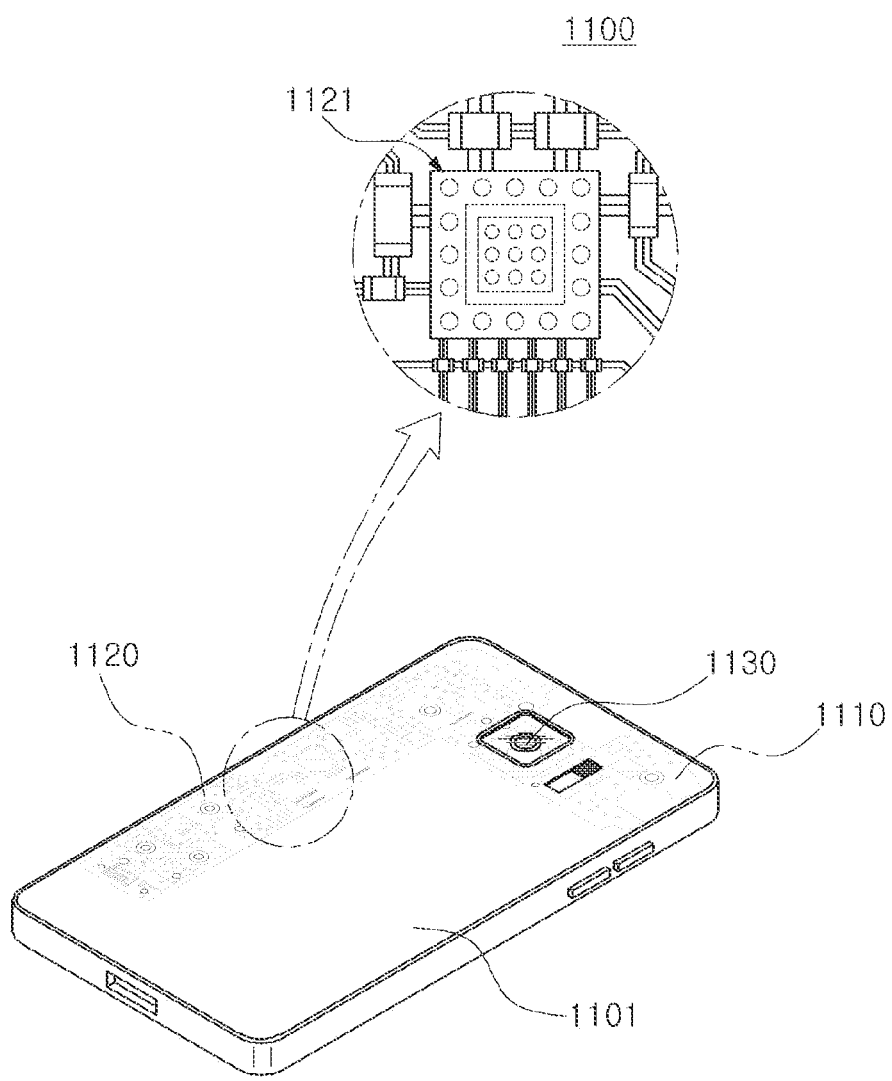
FIG. 2 is a schematic perspective view of an electronic device according to an exemplary embodiment of the present disclosure.

FIG. 2 is a schematic perspective view of an electronic device according to an exemplary embodiment.

Referring to FIG. 2, an electronic device may be, for example, a smartphone 1100. A mainboard 1110 may be accommodated in the smartphone 1100, and various electronic components 1120 may be physically and/or electrically connected to the mainboard 1110. In addition, other electronic components, such as a camera module 1130 and/or a speaker, which may or may not be physically and/or electrically connected to the mainboard 1110, may be accommodated therein. A portion of the electronic components 1120 may be the above-described chip related components, for example, a semiconductor package 1121, but are not limited thereto. The semiconductor package 1121 may be a surface in which a semiconductor chip or a passive component is mounted on a package substrate in a package substrate form, but is not limited thereto. The electronic device is not necessarily limited to the smartphone 1100, but may be other electronic devices as described above.

Electronic Component-Embedded Substrate

Figure 3:
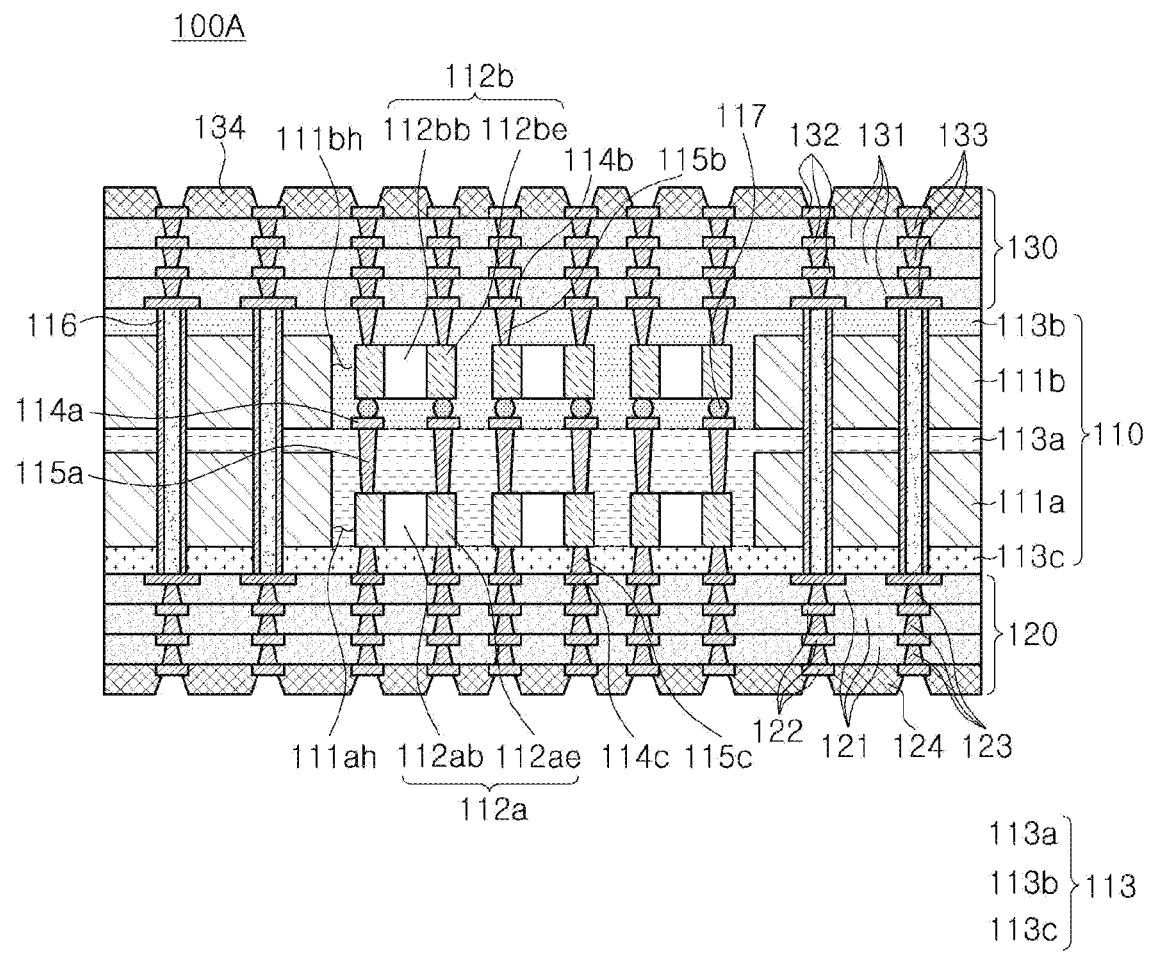
FIG. 3 is a schematic cross-sectional view of an electronic component-embedded substrate according to an exemplary embodiment of the present disclosure.

FIG. 3 is a schematic cross-sectional view of an electronic component-embedded substrate 100A according to an exemplary embodiment.

Referring to FIG. 3, the electronic component-embedded substrate 100A may include a core structure 110.

In addition, the electronic component-embedded substrate 100A may further include a first build-up structure 120, disposed on one side of the core structure 110, and a second build-up structure 130 disposed on the other side of the core structure 110. The one side of the core structure 110 may refer to a side on which a first core layer 111a is disposed, and the other side of the core structure 110 may refer to a side on which a second core layer 111b is disposed. However, the first build-up structure 120 and the first build-up structure 130 are additional components which may be omitted depending on design conditions.

The core structure 110 may include the first core layer 111a having a first through-hole 111ah, a first passive component 112a disposed in the first through-hole 111ah, a second core layer 111b disposed on the first core layer 111a and having a second through-hole 111bh, a second passive component 112b disposed in the second through-hole 111bh, and an insulating material 113 covering the first passive component 112a and the second passive component 112b while filling at least a portion of each of the first through-hole 111ah and the second through-hole 111bh.

The insulating material 113 may include a first insulating material 113a, a second insulating material 113b, and a third insulating material 113c. The first insulating material 113a may cover the first passive component 112a while filling at least a portion of the first through-hole 111ah. In addition, the first insulating material 113a may cover a surface of the first core layer 111a facing the second core layer 111b. Accordingly, the first insulating material 113a may fill a space between the first core layer 111a and the second core layer 111*b*. The second insulating material 113*b* may cover the second passive component 112*b* while filling at least a portion of the second through-hole 111*bh*. In addition, the second insulating material 113*b* may cover a surface opposing a surface of the second core layer 111*b* facing the first core layer 111*a*. The third insulating material 113*c* may be disposed on a side opposing the side of the first core layer 111*a*, on which the second core layer 111*b* is disposed, to cover one surface of each of the first passive component 112*a* and the second insulating material 113*b*. In addition, the third insulating material 113*c* may cover a surface opposing a surface of the first core layer 111*a* facing the second core layer 111*b*.

In this case, boundaries between the first insulating material 113*a*, the second insulating material 113*b*, and the third insulating material 113*c* may or may not be apparent. Therefore, the boundaries between the first insulating material 113*a*, the second insulating material 113*b*, and the third insulating material 113*c* are indicated by dashed lines in the drawing. When the boundaries between the first insulating material 113*a*, the second insulating material 113*b*, and the third insulating material 113*c* are not apparent, the first insulating material 113*a*, the second insulating material 113*b*, and the third insulating material 113*c* may be integrated to constitute a single insulating material 113.

The core structure 110 may further include a first wiring layer 114*a* disposed on a level between the first passive component 112*a* and the second passive component 112*b* in such a manner that at least portion of the first wiring layer 114*a* is covered with the insulating material 113. The first passive component 112*a* and the second passive component 112*b* may be connected to each other by the first wiring layer 114*a*. According to a process to be described later, the first wiring layer 114*a* may be disposed on the first insulating material 113*a* together with the second core layer 111*b*. Thus, a surface, on which the second core layer 111*b* is in contact with the first insulating material 113*a*, and a surface, on which the first wiring layer 114*a* is in contact with the first insulating material 113*a*, may be coplanar with each other. Similarly, a surface of the second core layer 111*b* facing the first core layer 111*a* and a surface of the first wiring layer 114*a* facing the first passive component 112*a* may be coplanar with each other. In addition, the core structure 110 may further include a first via layer 115*a* having a first via embedded in the insulating material 113 to connect the first passive component 112*a* and the first wiring layer 114*a* to each other. Each via of the first via layer 115*a* may penetrate through a portion of the first insulating material 113*a*.

The core structure 110 may further include a second wiring layer 114*b*, disposed on the second insulating material 113*b* and connected to the second passive component 112*b*, and a second via layer 115*b* penetrating through the second insulating material 113*b* and connecting the second passive component 112*b* and the second wiring layer 114*b* to each other. In addition, the core structure 110 may further include a third wiring layer 114*c*, disposed on the third insulating material 113*c* and connected to the first passive component 112*a*, and a third via layer 115*c* penetrating through the third insulating material 113*c* and connecting the first passive component 112*a* and the third wiring layer 114*c* to each other.

The core structure 110 may further include a through-via 116 penetrating through the first core layer 111*a*, the second core layer 111*b*, and the insulating material 113 and connecting the second wiring layer 114*b* and the third wiring layer 114*c* to each other.

The core structure 110 may further include a connection conductor 117 disposed on the first wiring layer 114*a*, and the second passive component 112*b* may be connected to the first wiring layer 114*a* through the connection conductor 117. One among or a combination of two or more among the first wiring layer 114*a*, the first via layer 115*a*, and the connection conductor 117 may be as a conductive structure to connect the first passive component and the second passive component to each other.

The first build-up structure 120 may include a first insulating layer 121, a fourth wiring layer 122 disposed on the first insulating layer 121 and connected to the first passive component 112*a*, and a fourth via layer 123 penetrating through the first insulating layer 121 to be connected to the fourth wiring layer 122. In addition, the first build-up structure 120 may further include a first protective layer 124 disposed on the first insulating layer 121 to cover at least a portion of the fourth wiring layer 122. In this case, the first insulating layer 121, the fourth wiring layer 122, and the fourth via layer 123 may be a plurality of first insulating layers 121, a plurality of fourth wiring layers 122, and a plurality of via layers 123, respectively.

The second build-up structure 130 may include a second insulating layer 131, a fifth wiring layer 132 disposed on the second insulating layer 131 and connected to the second passive component 112*b*, and a fifth via layer 133 penetrating through the second insulating layer 131 to be connected to the fifth wiring layer 132. In addition, the second build-up structure 130 may further include a second protective layer 134 disposed on the second insulating layer 131 to cover at least a portion of the fifth wiring layer 132. In this case, the second insulating layer 131, the fifth wiring layer 132, and the fifth via layer 133 may be a plurality of second insulating layers 131, a plurality of fifth wiring layers 132, and a plurality of via layers 133, respectively.

In the case of the present disclosure, a plurality of first passive components 112*a* and a plurality of second passive components 112*b* may be connected to each other by the first wiring layer 114*a* disposed on the first insulating material 113*a*. As a result, an electronic component-embedded substrate, capable of achieving high-density integration, may be provided.

Hereinafter, each configuration of an electronic component-embedded substrate 100A according to an exemplary embodiment will be described in more detail.

Each of the first core layer 111*a* and the second core layer 111*b* may serve to reduce rigidity of the substrate to suppress the warpage of the substrate, and the like. A material for forming each of the first core layer 111*a* and the second core layer 111*b* is not necessarily limited, and any material may be used, as long as it has insulating properties. For example, the material for forming each of the first core layer 111*a* and the second core layer 111*b* may be a thermosetting resin such as an epoxy resin, a thermoplastic resin such as a polyimide, or a resin in which these resins are impregnated with a core such as glass fiber, glass cloth, or glass fabric together with an inorganic filler, for example, a copper clad laminate (CCL) or an unclad CCL. Alternatively, the material for forming each of the first core layer 111*a* and the second core layer 111*b* may include another type of material such as a glass substrate or a ceramic substrate.

Each of the first passive component 112*a* and the second passive component 112*b* may be a passive component such as a capacitor, an inductor, or the like. The types of the first passive component 112*a* and the second passive component 112*b* may be the same or may be different from each other. As illustrated in the drawing, each of the first passive component 112a and the second passive component 112b may be a plurality of first passive components 112a and a plurality of second passive components 112b, respectively. The plurality of passive components 112a may be disposed to be spaced apart from each other in the first through-hole 111ah, and the plurality of second passive components 112b may be disposed to be spaced apart from each other in the second through-hole 111bh.

The first passive component 112a may include a first body 112ab and a first electrode 112ae, and the second passive component 112b may include a second body 112bb and a second electrode 112be. Accordingly, the first passive component 112a and the second passive component 112b may be electrically connected to at least one of the first, second, and third wiring layers 114a, 114b, and 114c through the first electrode 112ae and the second electrode 112be, respectively.

An exemplary embodiment may be implemented by replacing the first passive component 112a and/or the second passive component 112b with an active component depending on design conditions by a person of ordinary skill in the art. Such an embodiment may also be considered to be within the scope of the present disclosure.

The insulating material 113 may serve to protect the first passive component 112a and the second passive component 112b. Alternatively, the insulating material 113 may serve to attach the first core layer 111a and the second core layer 111b to each other, to protect the first core layer 111a and the second core layer 111b, and the like. An insulating material may be used as a material for forming the insulating material 113. In this case, the insulating material may be a thermosetting resin such as an epoxy resin, a thermoplastic resin such as a polyimide, or a resin in which these resins are impregnated with a core such as glass fiber, glass cloth, or glass fabric together with an inorganic filler, for example, a prepreg (PPG), or the like.

As described above, the insulating material 113 may include a first insulating material 113a, a second insulating material 113b, and a third insulating material 113c. In this case, the first insulating material 113a, the second insulating material 113b, and the third insulating material 113c may include the same material or different materials. In addition, boundaries between the first insulating material 113a, the second insulating material 113b, and the third insulating material 113c may be apparent, but may not be apparent.

Each of the first wiring layer 114a, the second wiring layer 114b, and the third wiring layer 114c may perform various functions, depending on a design thereof. For example, each of the first wiring layer 114a, the second wiring layer 114b, and the third wiring layer 114c may include a ground (GND) pattern, a power (PWR) pattern, a signal (S) pattern, and the like. In this case, the signal (S) pattern may include various signals except for the ground (GND) pattern, the power (PWR) pattern, and the like, for example, a data signal, and the like. In addition, each of the first wiring layer 114a, the second wiring layer 114b, and the third wiring layer 114c may include a wiring pad connected to the first passive component 112a and/or the second passive component 112b.

A material for forming each of the first wiring layer 114a, the second wiring layer 114b, and the third wiring layer 114c may be a conductive material. For example, a material for forming each of the first wiring layer 114a, the second wiring layer 114b, and the third wiring layer 114c may be a metal material such as copper (Cu), aluminum (Al), silver (Ag), tin (Sn), gold (Au), nickel (Ni), lead (Pb), titanium (Ti), alloys thereof, or the like, but is not limited thereto.

Each of the first via layer 115a, the second via layer 115b, and the third via layer 115c may also perform various functions, depending on a design thereof. For example, each of the first via layer 115a, the second via layer 115b, and the third via layer 115c may include a via for grounding, a via for power, and a via for signal. Each of the first via layer 115a, the second via layer 115b, and the third via layer 115c may include a via connected to the first passive component 112a and/or the second passive component 112b.

A material for forming each of the first via layer 115a, the second via layer 115b, and the third via layer 115c may also be a conductive material. For example, a material for forming each of the first via layer 115a, the second via layer 115b, and the third via layer 115c may be a metal material such as copper (Cu), aluminum (Al), silver (Ag), tin (Sn), gold (Au), nickel (Ni), lead (Pb), titanium (Ti), alloys thereof, and the like, but is not limited thereto.

Each of the vias, included in the first, second, third vias 115a, 115b, and 115c may be formed by completely filling a via hole with a conductive material, or the conductive material may be formed along a wall of the via hole. When the via is formed of a conductive material along the wall of the via hole, the via hole may be filled with an insulating material. In addition, shapes of the vias, included in the first, second, third vias 115a, 115b, and 115c, may have all shapes known in the art, such as a tapered shape, a cylindrical shape, and the like.

The through-via 116 may penetrate through the first core layer 111a, the second core layer 111b, and the insulating material 113, and may connect the second wiring layer 114b and the third wiring layer 114c to each other.

A material for forming the through-via 116 may also be a conductive material. For example, a material for forming the through-via 116 may be a metal material such as copper (Cu), aluminum (Al), silver (Ag), tin (Sn), gold (Au), nickel (Ni), lead (Pb), titanium (Ti), alloys thereof, and the like, but is not limited thereto.

The through-via 116 may be formed by completely filling a via hole with a conductive material, or the conductive material may be formed along a wall of the via hole. When the through-via 116 is formed of a conductive material along the wall of the via hole, the via hole may be filled with an insulating material. In addition, shapes of the through-via 116 may have all shapes known in the art, such as a tapered shape, a cylindrical shape, and the like.

The connection conductor 117 may serve to physically and electrically connect the second passive component 112b and the first wiring layer 114a to each other, or the like. A material for forming the connection conductor 117 may be a low-melting-point metal, for example, a solder including tin (Sn), aluminum (Al), copper (Cu), or the like, but is not limited thereto.

Each of the first insulating layer 121 and the second insulating layer 131 may include an insulating material. The insulating material may be a thermosetting resin such as an epoxy resin, a thermoplastic resin such as a polyimide, or a resin in which these resins are impregnated with a core such as glass fiber, glass cloth, or glass fabric together with an inorganic filler, for example, an Ajinomoto Build-up Film (ABF), or the like, but is not limited thereto. Each of the first insulating layer 121 and the second insulating layer 131 may include the same material as the insulating material 113 or may include different materials. A boundary between adjacent first insulating layers 121 and a boundary between adjacent second insulating layers 131 may also be apparent, but may not be apparent.

The number of layers of each of the first insulating layer 121 and the second insulating layer 131 is not necessarily limited, and may vary depending on designs thereof. The number of layers of the first insulating layer 121 and the number of layers of the second insulating layer 131 may be the same or different from each other. In addition, each of the first and second insulating layers 121 and 131 may have a smaller thickness than each of the first and second core layers 111a and 111b.

Each of the fourth wiring layer 122 and the fifth wiring layer 132 may perform various functions depending on a design thereof. For example, each of the fourth wiring layer 122 and the fifth wiring layer 132 may include a ground (GND) pattern, a power (PWR) pattern, a signal (S) pattern, and the like. In this case, the signal (S) pattern may include various signals except for the ground (GND) pattern, the power (PWR) pattern, and the like, for example, a data signal, and the like. In addition, each of the fourth wiring layer 122 and the fifth wiring layer 132 may include various pads.

A material for forming each of the fourth and fifth wiring layers 122 and 132 may be a conductive material. For example, a material for forming each of the fourth and fifth wiring layers 122 and 132 may be a metal material such as copper (Cu), aluminum (Al), silver (Ag), tin (Sn), gold (Au), nickel (Ni), lead (Pb), titanium (Ti), alloys thereof, and the like, but is not limited thereto.

Each of the fourth via layer 123 and the fifth via layer 133 may also perform various functions, depending on a design thereof. For example, each of the fourth via layer 123 and the fifth via layer 133 may include a via for grounding, a via for power, a via for a signal via, or the like.

A material for forming each of the fourth and fifth via layers 123 and 133 may be a conductive material. For example, a material for forming each of the fourth and fifth via layers 123 and 133 may be a metal material such as copper (Cu), aluminum (Al), silver (Ag), tin (Sn), gold (Au), nickel (Ni), lead (Pb), titanium (Ti), alloys thereof, and the like, but is not limited thereto.

Each of the vias, included in the fourth and fifth vias layer 123 and 133 may be formed by completely filling a via hole with a conductive material, or the conductive material may be formed along a wall of the via hole. When the via is formed of a conductive material along the wall of the via hole, the via hole may be filled with an insulating material. In addition, shapes of the vias, included in the fourth and fifth via layers 123 and 133, may have all shapes known in the art, such as a tapered shape, a cylindrical shape, and the like.

The first protective layer 124 and the second protective layer 134 may serve to protect the fourth wiring layer 122 and the fifth wiring layer 132, respectively. The first protective layer 124 may have an opening exposing a portion of the fourth wiring layer 122, and the second protective layer 134 may have an opening exposing a portion of the fifth wiring layer 132.

A material for forming each of the first protective layer 124 and the second protective layer 134 is not necessarily limited. For example, a material for forming each of the first protective layer 124 and the second protective layer 134 may be a solder resist, but is not limited thereto. A material for forming each of the first protective layer 124 and the second protective layer 134 may be an insulating material such as a prepreg, an Ajinomoto Build-up Film (ABF), or the like.

FIGS. 4A to 4J are schematic process diagrams illustrating a process of manufacturing an electronic component-embedded substrate according to an exemplary embodiment.

Figure 4A:
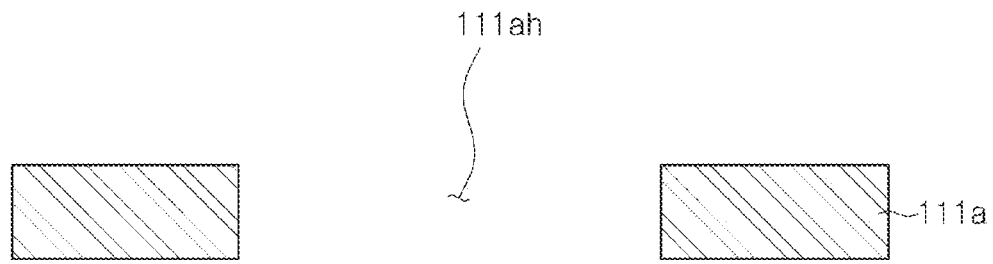
FIGS. 4A to 4J are schematic process diagrams illustrating a process of manufacturing an electronic component-embedded substrate according to an exemplary embodiment of the present disclosure.

Referring to FIG. 4A, a first through-hole 111ah may be formed in a first core layer 111a. A method of forming the first through-hole 111ah is not necessarily limited, and may be a known method such as laser drilling or mechanical drilling.

Figure 4B:
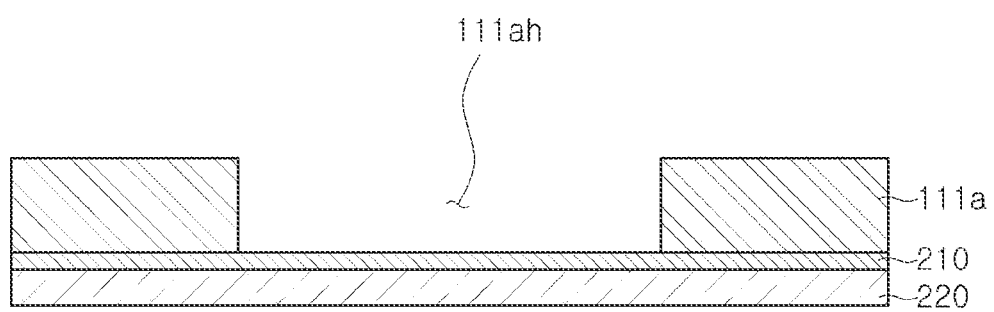

Referring to FIG. 4B, the first core layer 111a, in which the first through-hole 111ah is formed, may be attached to a carrier 220 and an adhesive film 210.

Figure 4C:
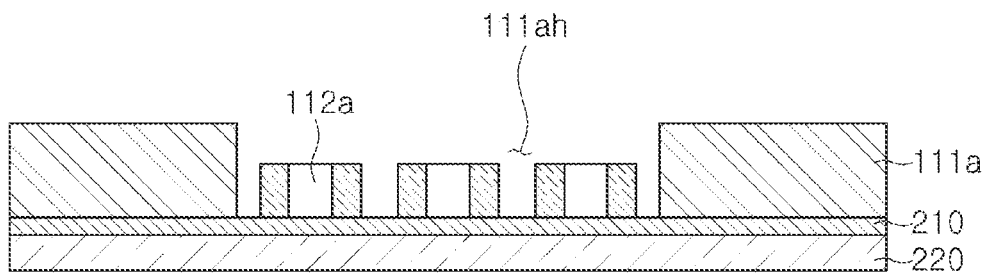

Referring to FIG. 4C, a first passive component 112a is disposed in the first through-hole 111ah. In this case, the first passive component 112a may be disposed in a manner of attaching to the adhesive film 210 exposed through the first through-hole 111ah.

Figure 4D:
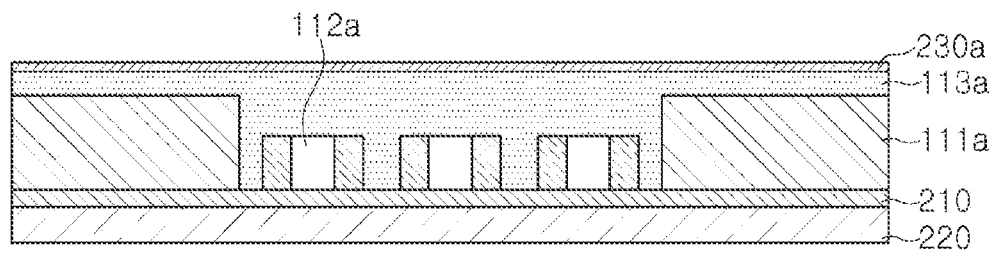

Referring to FIG. 4D, a first insulating material 113a may be formed to cover at least a portion of the first passive component 112a while filling the first through-hole 111ah. In this case, the first insulating material 113a may be formed by sequentially stacking the first insulating material 113a and a first copper clad 230a and then laminating the same.

Figure 4E:
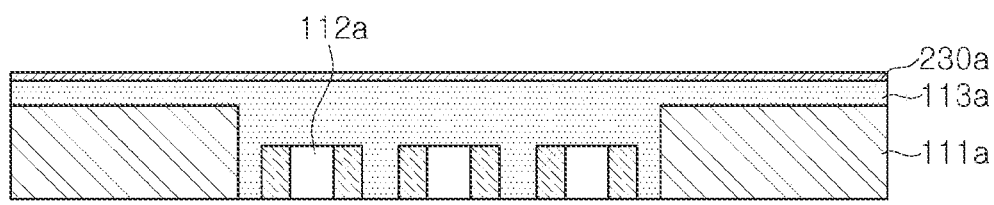

Referring to FIG. 4E, the carrier 220 and the adhesive film 210 may be removed. The carrier 220 and the adhesive film 210 may be removed in a manner of delaminating the adhesive film 210.

Figure 4F:
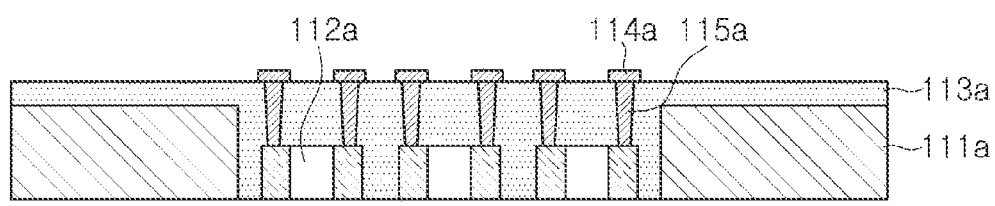

Referring to FIG. 4F, a first wiring layer 114a may be formed on the first insulating material 113a, and a first via layer 115a may be formed to penetrate through the first insulating material 113a. The first wiring layer 114a and the first via layer 115a may be formed by a known plating process after forming a via hole using laser drilling or mechanical drilling, and the first copper clad 230a may be used as a seed layer.

Figure 4G:
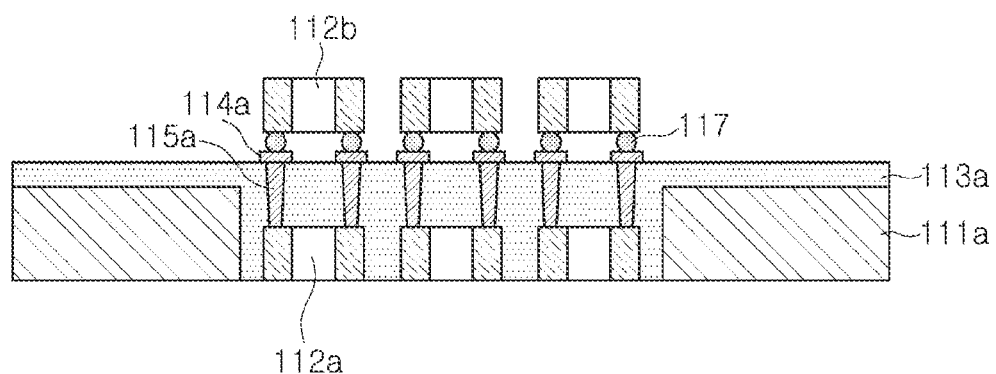

Referring to FIG. 4G, a second passive component 112b may be mounted on the first wiring layer 114a. The second passive component 112b may be mounted on the first wiring layer 114a through a connection conductor 117.

Figure 4H:
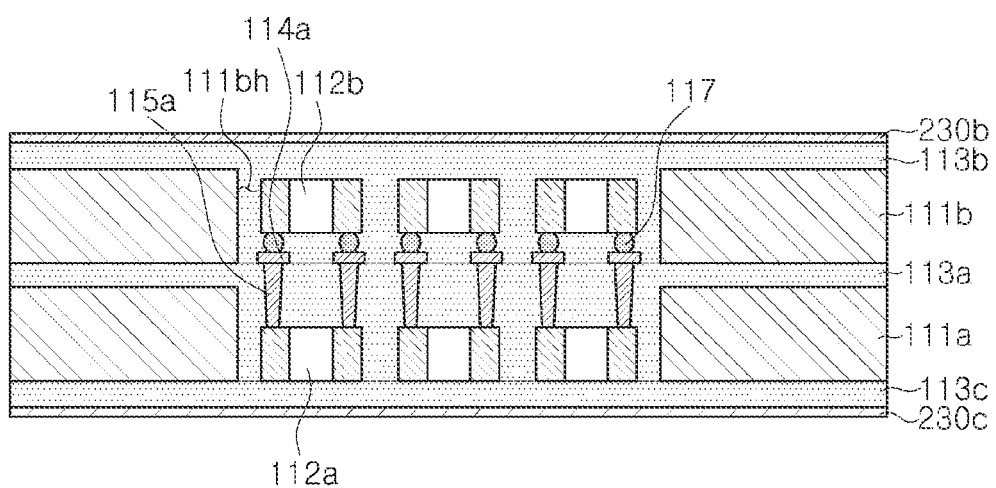

Referring to FIG. 4H, a second core layer 111b, in which a second through-hole 111bh is formed, may be disposed on the first insulating material 113a, and a second insulating material 113b and a third insulating material 113c may be formed. In this case, a method of forming the second through-hole 111bh is also not necessarily limited, and may be a known method such as laser drilling or mechanical drilling. The second insulating material 113b may be formed by sequentially stacking the second insulating material 113b and a second copper clad 230b and then laminating the same. In addition, the third insulating material 113c may also be formed by sequentially stacking the third insulating material 113c and a third copper clad 230c and laminating the same.

Each of the first insulating material 113a, the second insulating material 113b, and the third insulating material 113c may be formed in a manner of laminating an uncured prepreg and curing the laminated prepreg. Boundaries between the insulating material 113a, the second insulating material 113b, and the third insulating material 113c may not be apparent. However, the present disclosure is not limited thereto, and the boundaries may be apparent, depending on a material for forming the first, second, and third insulating materials 113a, 113b, and 113c, a method of forming the same, and the like.

Figure 4I:
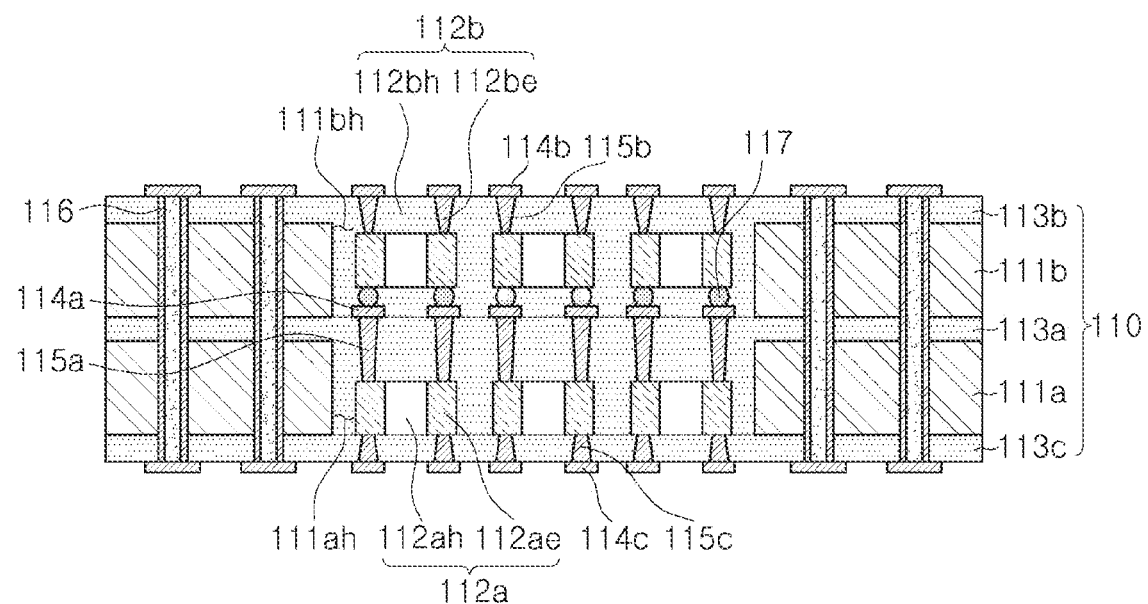

Referring to FIG. 4I, a second wiring layer 114b may be formed on the second insulating material 113b, and a second via layer 115b may be formed to penetrate through the second insulating material 113b, and thus, a core structure may be formed. In addition, a third wiring layer 114c may be formed on the third insulating material 113c, and a third via layer 115c may be formed penetrate through the third insulating material 113c. In addition, a through-vias 116 may be formed penetrate through the first core layer 111a, the second core layer 111b, and the insulating material 113. A method of forming each of the second wiring layer 114b, the third wiring layer 114c, the second via layer 115b, the third via layer 115c, and the through-via 116 may be the same as the method of forming the first wiring layer 114a or the first via layer 115a.

Figure 4J:
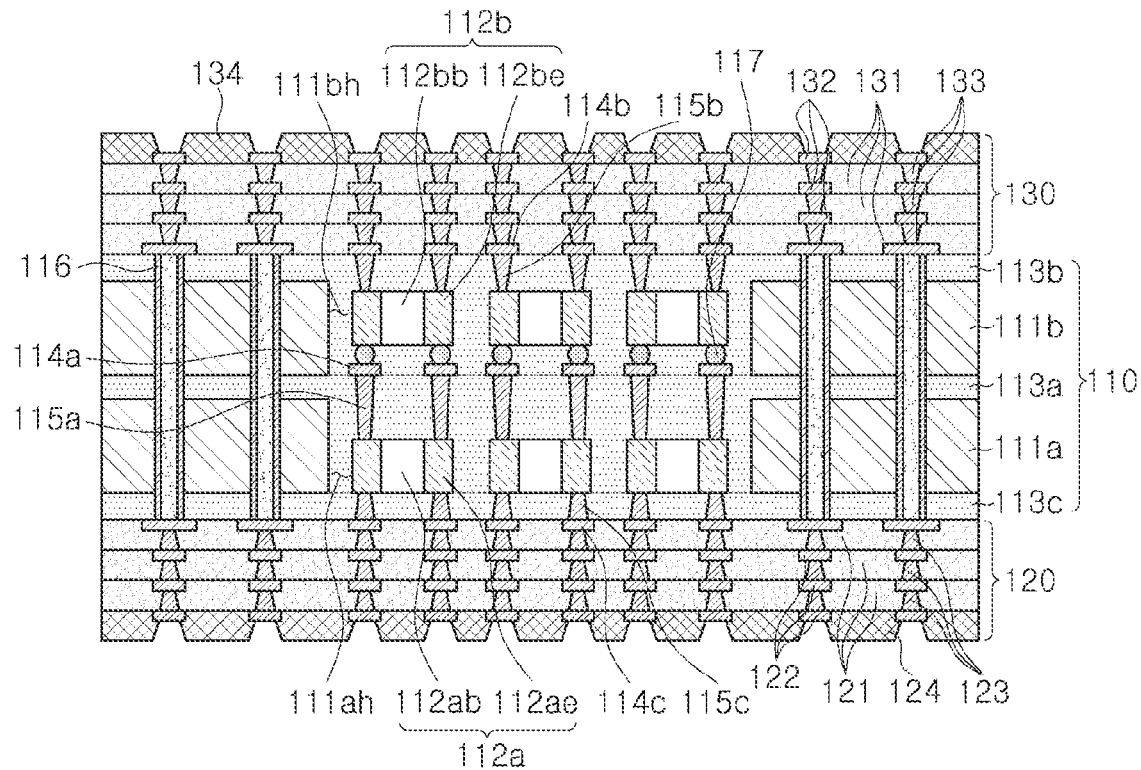

Referring to FIG. 4J, a first build-up structure 120 and a second build-up structure 130 may be formed on both sides of the core structure 110. Each of a first insulating layer 121 and a second insulating layer 131 may be formed by laminating an ABF, or the like, and curing the laminated ABF, or the like. A method of forming each of a fourth wiring layer 122, a fifth wiring layer 132, a fourth via layer 123, and a fifth via layer 133 may also be the same as the method of forming the first wiring layer 114a or the first via layer 115a. In addition, each of a first protective layer 124 and a second protective layer 134 may also be formed by laminating an ABF, or the like, and curing the laminated ABF, or the like.

Figure 5:
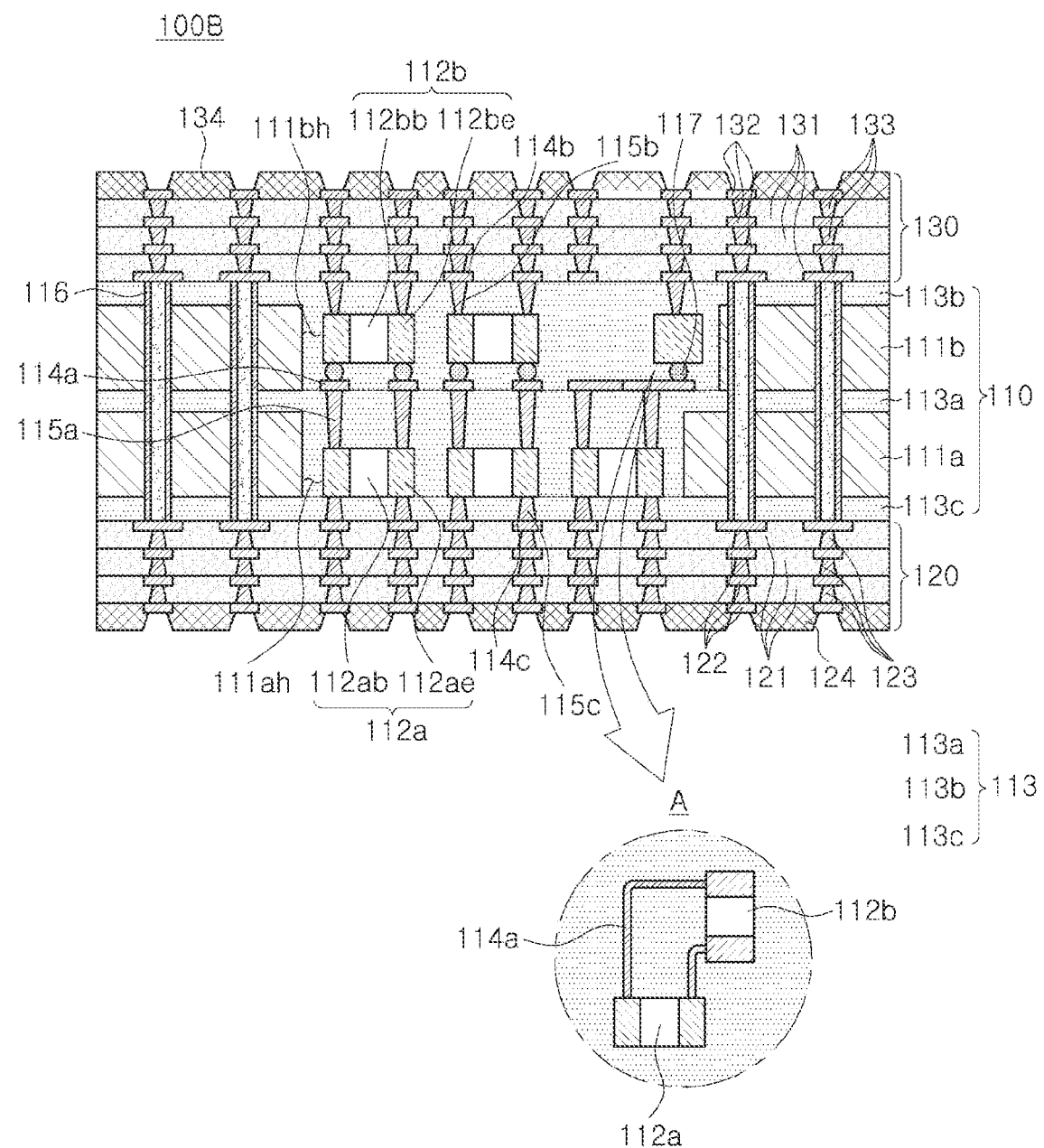
FIG. 5 is a schematic cross-sectional view of an electronic component-embedded substrate according to another exemplary embodiment of the present disclosure.

FIG. 5 is a schematic cross-sectional view of an electronic component-embedded substrate according to another exemplary embodiment of the present disclosure.

In FIG. 5, 'A' is a perspective section when a second passive component 112b and a first wiring layer 114a are viewed from above.

Referring to FIG. 5, in an electronic component-embedded substrate 100B according to another exemplary embodiment, the first passive component 112a and the second passive component 112b of the electronic component-embedded substrate 100A are disposed to be misaligned with each other on a plane.

As described above, the second passive component 112b may be connected to the first passive component 112a through a wiring pattern included in a first wiring layer 114a. In this case, the wiring pattern may be freely designed. Therefore, the first passive component 112a and the second passive component 112b may be connected to each other by a wiring pattern without vertically overlapping each other, and the wiring pattern may be designed to significantly improve characteristics such as signal integrity, power integrity, and the like.

The other details are substantially the same as those described above in the description of the electronic component-embedded substrate 100A according to an exemplary embodiment, and thus, detailed descriptions thereof will be omitted.

Figure 6:
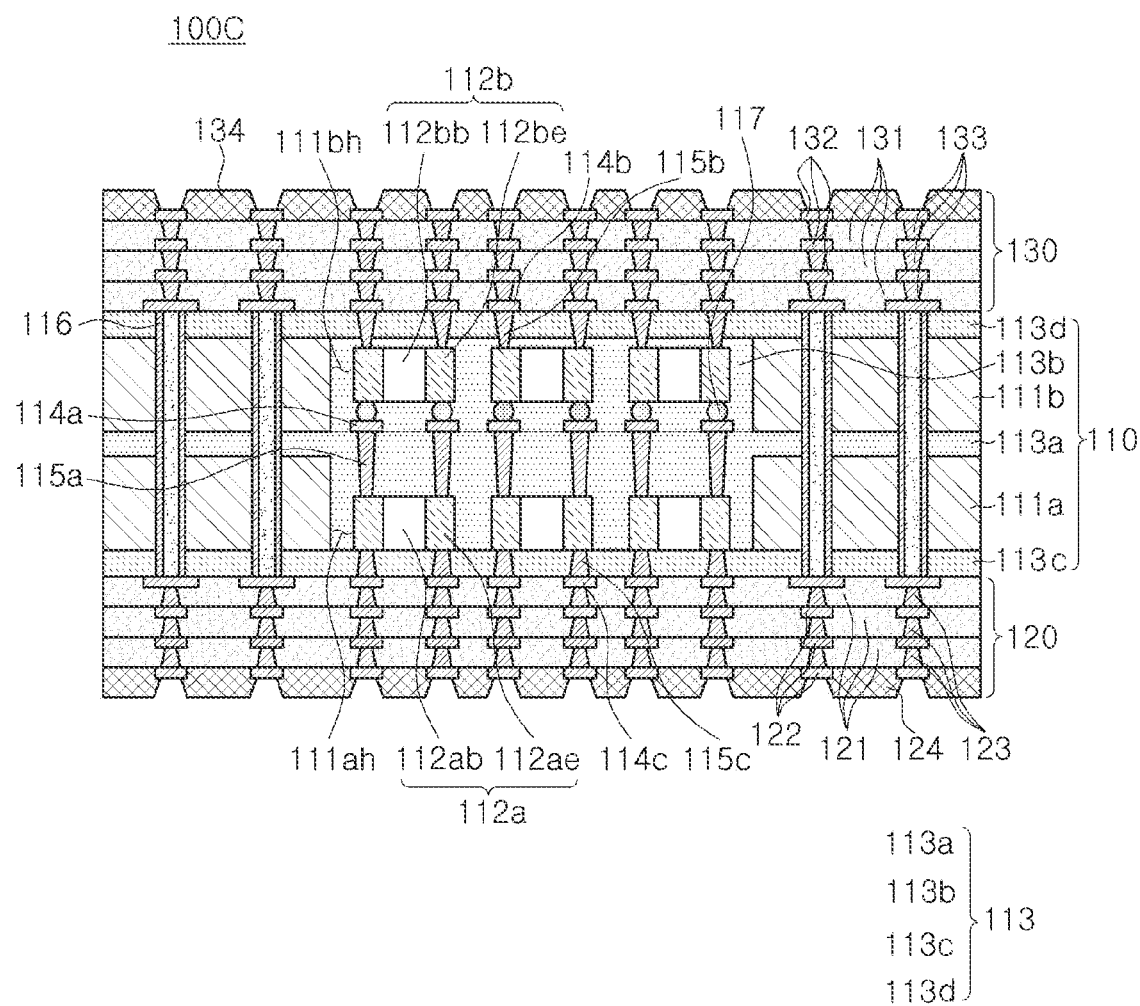
FIG. 6 is a schematic cross-sectional view of an electronic component-embedded substrate according to another exemplary embodiment of the present disclosure.

FIG. 6 is a schematic cross-sectional view of an electronic component-embedded substrate according to another exemplary embodiment of the present disclosure.

Referring to FIG. 6, in an electronic component-embedded substrate 100C according to another exemplary embodiment, an insulating layer 113 of the electronic component-embedded substrate 100A may include a first insulating material 113a, a second insulating material 113b, a third insulating material 113c, and a fourth insulating material 113a.

The first insulating material 113a may cover surfaces of a first passive component 112a and a first core layer 111a, facing a second core layer 111b, while filling at least a portion of a first through-hole 111ah. The second insulating material 113b may cover a second passive component 112b while filling at least a portion of a second through-hole 111bh. The third insulating material 113c may be disposed on a surface opposing a surface of the first core layer 111a facing the second core layer 111b. The fourth insulating material 113d may be disposed on a surface opposing a surface of the second core layer 111b facing the first core layer 111a.

The first insulating material 113a, the second insulating material 113b, the third insulating material 113c, and the fourth insulating material 113d may include the same material or different materials. Boundaries between adjacent two of the first insulating material 113, the second insulating material 113b, the third insulating material 113c, and the fourth insulating material 113d may be apparent, or may not be apparent. Only a portion of the boundaries between adjacent two of the first insulating material 113, the second insulating material 113b, the third insulating material 113c, and the fourth insulating material 113d may be apparent, and the other portions may not be apparent.

For example, each of the third insulating material 113c and the fourth insulating material 113d may include a material different from a material included in the first insulating material 113a and/or the second insulating material 113b. As a non-limiting example, the first insulating material 113a and the second insulating material 113b may be formed of a prepreg (PPG) such that the boundary between the first insulating material 113a and the second insulating material 113b may not be apparent, and each of the third insulating material 113c and the fourth insulating material 113d may be formed of an Ajinomoto Build-up Film (ABF) such that a boundary between each of the third insulating material 113c and the fourth insulating material 113d and each of the first insulating material 113a and the second insulating material 113b may be apparent. When each of the third insulating material 113c and the fourth insulating material 113d is formed of an Ajinomoto Build-up Film (ABF), a fine circuit pattern may be easily implemented.

The other details are substantially the same as those described above in the description of the electronic component-embedded substrate 100A according to an exemplary embodiment, and thus, detailed descriptions thereof will be omitted.

Figure 7:
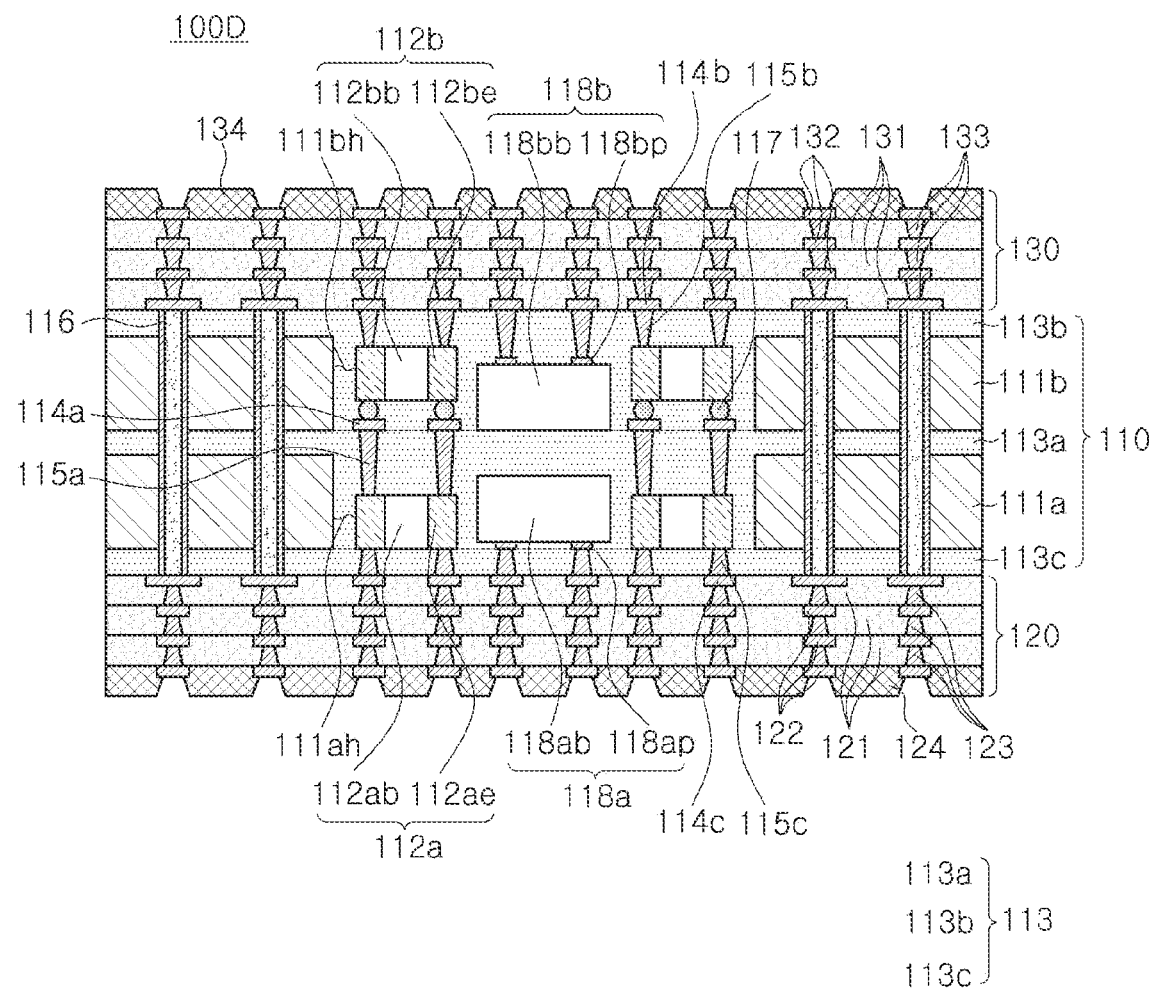
FIG. 7 is a schematic cross-sectional view of an electronic component-embedded substrate according to another exemplary embodiment of the present disclosure.

FIG. 7 is a schematic cross-sectional view of an electronic component-embedded substrate according to another exemplary embodiment of the present disclosure.

Referring to FIG. 7, in an electronic component-embedded substrate 100D according to another exemplary embodiment, a core structure 110 of the electronic component-embedded substrate 100A may further include a first die 118a and a second die 118b.

The first die 118a may be disposed to be spaced apart from a first passive component 112a in a first through-hole 111ah, and may include a body 118ab and a first connection pad 118ap. The second die 118b may be disposed to be spaced apart from a second passive component 112b in a second through-hole 111bh, and may include a second body 118bb and a second connection pad 118bp.

In this case, the first die 118a may be connected to a third wiring layer 114c through a via included in a third via layer 115c, and the second die 118b may be connected to a second wiring layer 114b through a via included in a second via layer 115b. The via, connecting each of the first die 118a and the second die 118b to each of the third wiring layer 114c and the second wiring layer 114b, may be formed to have a depth different from a depth of, or the same depth as, the via connecting each of the first passive component 112a and the second passive component 112b to each of the third wiring layer 114c and the second wiring layer 114b.

For example, the first connection pad 118ap may be disposed to face the third wiring layer 114c to be connected to the third wiring layer 114c, and the second connection pad 118bp may be disposed to face the second wiring layer 114b to be connected to the second wiring layer 114b. Accordingly, the second wiring layer 114b may include a wiring pattern connected to the second connection pad 118bp, and the third wiring layer 114c may include a wiring pattern connected to the first connection pad 118ap.

The second via layer 115b may have a via penetrating through a portion of the second insulating material 113b to connect the second connection pad 118bp and the second wiring layer 114b to each other, and the third via layer 115c may have a via penetrating through the third insulating material 113c to connect the first connection pad 118ap and the third wiring layer 114c to each other.

However, the disposition of each of the first die 118a and the second die 118b is not limited thereto, and the first connection pad 118ap may be disposed to face the second die 118b. In addition, the second connection pad 118bp may be disposed to face the first die 118a.

The other details are substantially the same as those described above in the description of the electronic component-embedded substrate 100A according to an exemplary embodiment, and thus, detailed descriptions thereof will be omitted.

Figure 8:
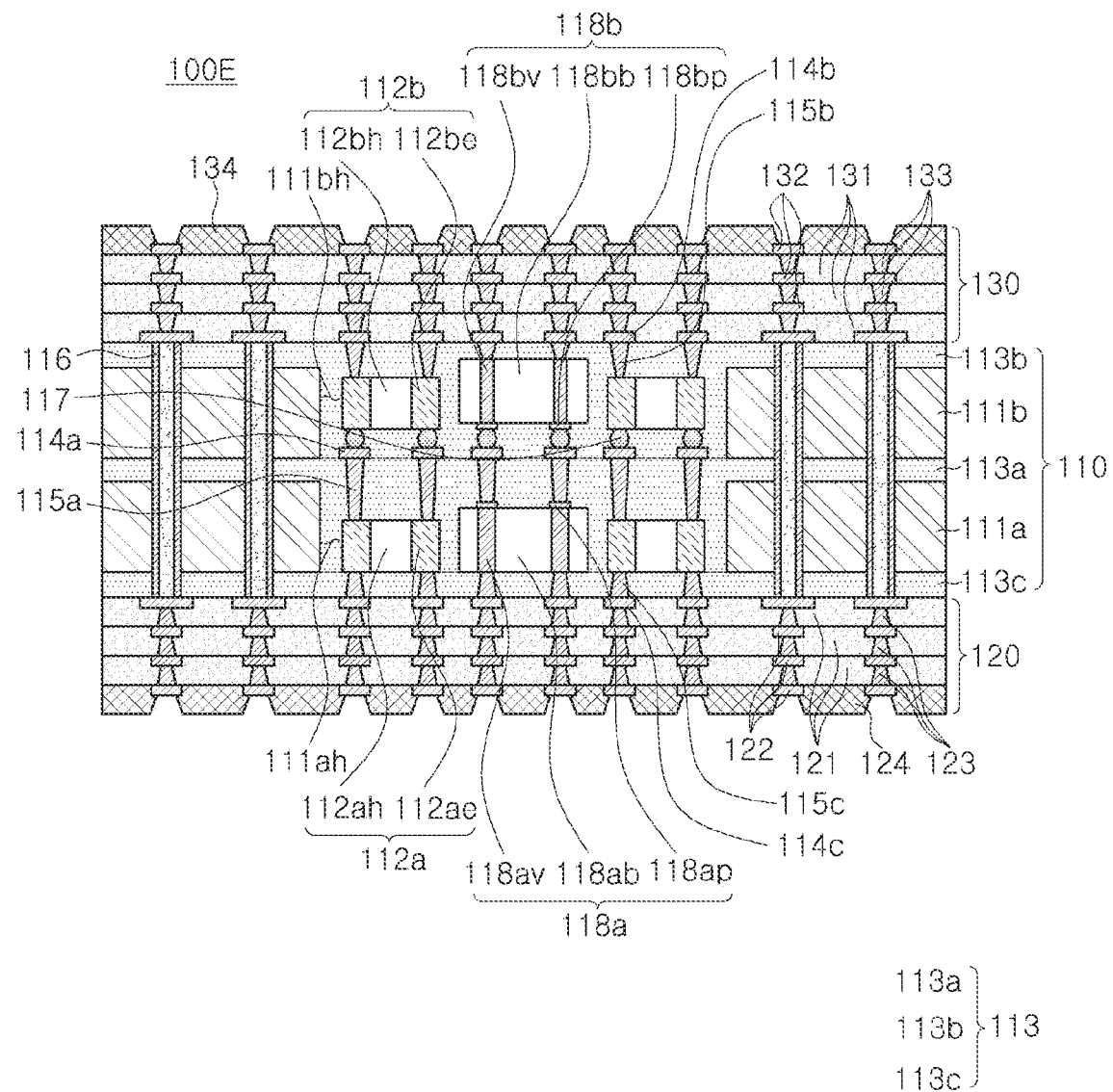
FIG. 8 is a schematic cross-sectional view of an electronic component-embedded substrate according to another exemplary embodiment of the present disclosure.

FIG. 8 is a schematic cross-sectional view of an electronic component-embedded substrate according to another exemplary embodiment of the present disclosure.

Referring to FIG. 8, in an electronic component-embedded substrate 100E according to another exemplary embodiment, each of the first connection pad 118ap and the second connection pad 118bp of the electronic component-embedded substrate 100D may be disposed to be face a first wiring layer 114a to be connected to a first wiring layer 114a. Accordingly, the first wiring layer 114a may include a wiring pattern connected to each of the first connection pad 118ap and the second connection pad 118bp.

In addition, the first via layer 115a may have a via penetrating through a portion of the first insulating material 113a to connect a first connection pad 118ap and the first wiring layer 114a to each other. The second connection pad 118bp may be connected to the first wiring layer 114a, disposed on the first wiring layer 114a, through a connection conductor 117 disposed on the first wiring layer 114a.

The first die 118a may further include a first through-electrode 118av penetrating through the first body 118ab, and the second die 118b may further include a second through-electrode 118bv penetrating through a second body 118bb. Each of the first through-electrode 118av and the second through-electrode 118bv may be connected to each of the first connection pad 118ap and the second connection pad 118bp.

In this case, the first through-electrode 118av may electrically connect the first connection pad 118ap and the third wiring layer 114c to each other, and the second through-electrode 118bv may electrically connect the second connection pad 118bp and the second wiring layer 114b to each other.

In addition, the second via layer 115b may have a via penetrating through a portion of the second insulating material 113b to connect the second through electrode 118bv and the second wiring layer 114b to each other, and the third via layer 115c may include a via penetrating through the third insulating material 113c to connect the first through-electrode 118av and the third wiring layer 114c to each other. Accordingly, the first through-electrode 118av may be connected to the third wiring layer 114c through the via of the third via layer 115c, and the second through-electrode 118bv may be connected to the second wiring layer 114b through the via of the second via layer 115b.

As illustrated in the drawing, when the second connection pad 118bp is disposed to face the first wiring layer 114a, the second connection pad 118bp may be easily connected to the first wiring layer 114a.

The other details are substantially the same as those described above in the description of the electronic component-embedded substrate 100A according to an exemplary embodiment and the electronic component-embedded substrate 100E according to another exemplary embodiment, and thus, detailed descriptions thereof will be omitted.

Figure 9:
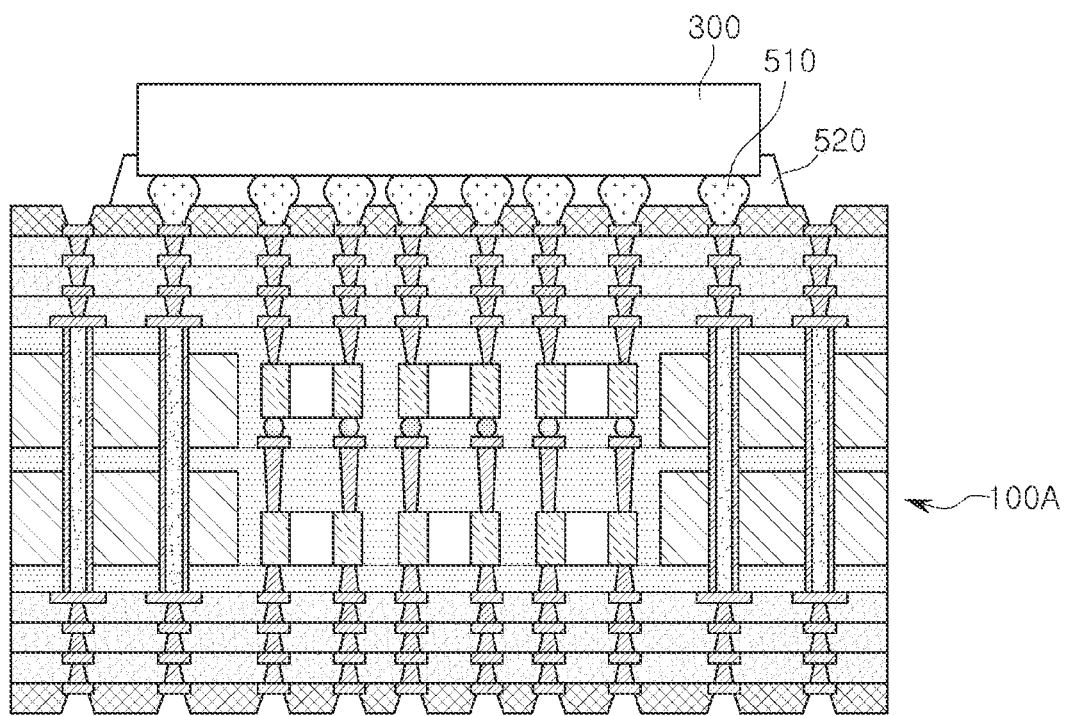
FIG. 9 is a schematic cross-sectional view illustrating an example of a state in which a semiconductor chip is disposed on an electronic component-embedded substrate according to an exemplary embodiment of the present disclosure.

FIG. 9 is a schematic cross-sectional view illustrating an example of a state in which a semiconductor chip is disposed on an electronic component-embedded substrate according to an exemplary embodiment of the present disclosure.

Referring to FIG. 9, a semiconductor chip 300 may be mounted on an electronic component-embedded substrate 100A according to an exemplary embodiment. A passive component may not be mounted on a substrate, but may be embedded in the electronic component-embedded substrate 100A. Therefore, the passive component may be electrically connected to the semiconductor chip 300 through a significantly short electrical path.

The semiconductor chip 300 may be a central processing unit (CPU), but is not limited thereto.

The semiconductor chip 300 may be mounted on passive component-embedded substrates 100B, 100C, 100D, and 100E according to other exemplary embodiments in substantially the same manner, as well as the electronic component-embedded substrate 100A according to an exemplar embodiment.

Figure 10:
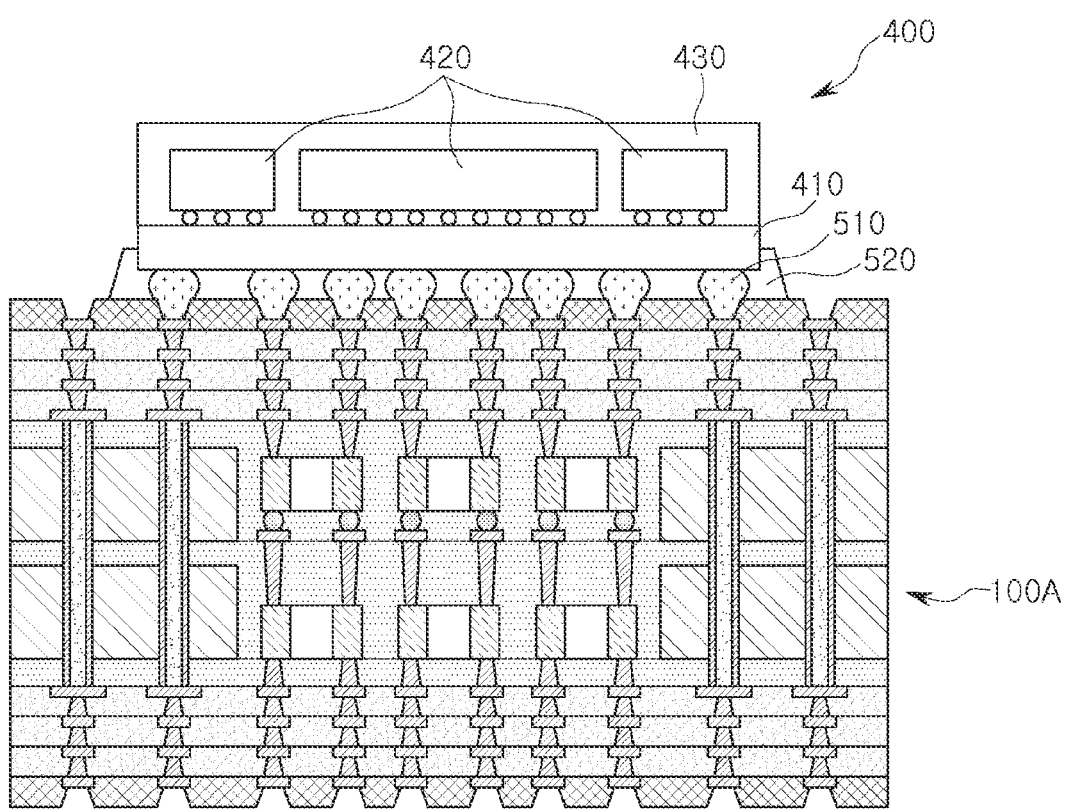
FIG. 10 is a schematic cross-sectional view illustrating an example of a state in which a semiconductor package is disposed on an electronic component-embedded substrate according to an exemplary embodiment of the present disclosure.

FIG. 10 is a schematic cross-sectional view illustrating an example of a state in which a semiconductor package is disposed on an electronic component-embedded substrate according to an exemplary embodiment of the present disclosure.

Referring to FIG. 10, a semiconductor package 400 may be mounted on an electronic component-embedded substrate 100A according to an exemplary embodiment. A passive component may not be mounted on a substrate, but may be embedded in the electronic component-embedded substrate 100A. Therefore, the passive component may be electrically connected to the semiconductor chip 300 in the semiconductor package 400 through a significantly short electrical path.

The semiconductor package 400 may include an interposer substrate 410 and one or more semiconductor chips 420 mounted on the interposer substrate 410, and may further include an encapsulant 430 covering the semiconductor chip 420.

The semiconductor chip 420 may include at least one of an application specific integrated circuit (ASIC) and a high bandwidth memory (HBM). For example, the semiconductor chip 420 may include one ASIC and two HBMs, but is not limited thereto.

The semiconductor package 400 may be mounted on passive component-embedded substrates 100B, 100C, 100D, and 100E according to other exemplary embodiments in substantially the same manner, as well as the electronic component-embedded substrate 100A according to an exemplar embodiment.

The term "coplanar" in the present specification may mean that components are disposed on substantially the same level, and is a concept including not only an exact same case but also a minute position difference which may occur due to an error in process.

The term of "connect" or "connection" in the present specification may be not only a direct connection, but also a concept including an indirect connection through an adhesive layer or the like. In addition, the term "electrically connected" or "electrical connection" in the present specification is a concept including both a physical connection and a physical non-connection.

Also, the expressions of "first," "second," and the like, in the present specification are used to distinguish one component from another, and do not limit the order and/or importance of the components. In some cases, without departing from the spirit of the present disclosure, a "first" component may be referred to as a "second" component, and similarly, a "second" component may be referred to as a "first" component.

As described above, an electronic component-embedded substrate, in which a plurality of electronic components are embedded, may be provided.

In addition, an electronic component-embedded substrate, capable of achieving high-density integration, may be provided.

In addition, an electronic component-embedded substrate, having improved signal integrity and power integrity, may be provided.

While exemplary embodiments have been shown and described above, it will be apparent to those skilled in the art that modifications and variations could be made without departing from the scope of the present disclosure as defined by the appended claims.

What is claimed is:

1. An electronic component-embedded substrate, comprising:
   a first core layer having a first through-hole;
   a first passive component disposed in the first through-hole;
   a second core layer disposed on the first core layer and having a second through-hole;
   a second passive component disposed in the second through-hole;
   an insulating material covering at least a portion of each of the first passive component and the second passive component and disposed in at least a portion of each of the first through-hole and the second through-hole;
   a first wiring layer disposed in the second through-hole and on a level between the first passive component and the second passive component such that at least a portion of an upper surface of the first wiring layer is covered with the insulating material arranged between the second passive component and the upper surface of the first wiring layer;
   a second wiring layer disposed on the insulating material and connected to the second passive component;
   a third wiring layer disposed on the insulating material and connected to the first passive component;
   a first die disposed to be spaced apart from the first passive component in the first through-hole and including a first body and a first connection pad; and
   a second die disposed to be spaced apart from the second passive component in the second through-hole and including a second body and a second connection pad,
   wherein the second die is connected to the second wiring layer,
   wherein the first die is connected to the third wiring layer, and
   wherein the first passive component and the second passive component are connected to each other by the first wiring layer.

2. The electronic component-embedded substrate of claim 1, further comprising:
   a first via layer embedded in the insulating material and connecting the first passive component and the first wiring layer to each other.

3. The electronic component-embedded substrate of claim 1, further comprising:
   a connection conductor disposed on the first wiring layer, wherein the second passive component is connected to the first wiring layer through the connection conductor.

4. The electronic component-embedded substrate of claim 1, wherein a surface of the second core layer, facing the first core layer, and a surface of the first wiring layer, facing the first passive component, are coplanar with each other.

5. The electronic component-embedded substrate of claim 1, wherein the first passive component and the second passive component are disposed to be misaligned with each other on a plane.

6. The electronic component-embedded substrate of claim 1, wherein the insulating material covers a surface of the first core layer, opposing another surface of the first core layer facing the second core layer, and a surface of the second core layer, opposing another surface of the second core layer facing the first core layer, and is disposed in a space between the first core layer and the second core layer.

7. The electronic component-embedded substrate of claim 1, further comprising:
   a through-via penetrating through the first core layer, the second core layer, and the insulating material and connecting the second wiring layer and the third wiring layer to each other.

8. The electronic component-embedded substrate of claim 1, wherein the first connection pad is disposed to face the third wiring layer to be connected to the third wiring layer, and
   the second connection pad is disposed to face the second wiring layer to be connected to the second wiring layer.

9. The electronic component-embedded substrate of claim 1, wherein each of the first connection pad and the second connection pad is disposed to face the first wiring layer to be connected to the first wiring layer.

10. The electronic component-embedded substrate of claim 1, wherein the first passive component includes a plurality of first passive components,
    the second passive components includes a plurality of second passive components,
    the plurality of first passive components are disposed to be spaced apart from each other in the first through-hole, and
    the plurality of second passive components are disposed to be spaced apart from each other in the second through-hole.

11. The electronic component-embedded substrate of claim 3, wherein the connection conductor comprises a solder.

12. The electronic component-embedded substrate of claim 6, wherein the insulating material includes a first insulating material covering at least a portion of the first passive component, a second insulating material disposed on the second core layer and covering at least a portion of the second passive component, and a third insulating material disposed on the first core layer.

13. The electronic component-embedded substrate of claim 9, wherein the first die further includes a first through-electrode penetrating through the first body and connecting the first connection pad and the third wiring layer to each other, the second die further includes a second through-electrode penetrating through the second body and connecting the second connection pad and the second wiring layer to each other.

14. The electronic component-embedded substrate of claim 12, wherein at least one of the second insulating material and the third insulating material includes a material different from a material included in the first insulating material.

15. An electronic component-embedded substrate comprising:
a core structure including a first core layer having a first through-hole, a first passive component disposed in the first through-hole, a second core layer disposed on the first core layer and having a second through-hole, a second passive component disposed in the second through-hole, and an insulating material covering each of the first passive component and the second component and disposed in at least a portion of each of the first through-hole and the second through-hole;
a first build-up structure including a first insulating layer and a first wiring layer connected to the first passive component, the first core layer disposed between the first build-up structure and the second core layer; and
a second build-up structure including a second insulating layer and a second wiring layer connected to the second passive component, the second core layer disposed between the second build-up structure and the first core layer,
wherein the insulating material integrally covers a side surface of the second passive component and a surface of the second passive component facing the second build-up structure,
wherein the insulating material extends from another surface of the second passive component, opposite the surface of the second passive component facing the second build-up structure, to the first passive component, and
wherein the first passive component and the second passive component are disposed to be misaligned with each other on a plane.

16. The electronic component-embedded substrate of claim 15, further comprising:
a via embedded in the insulating material and connecting the first passive component and the first wiring layer to each other.

17. An electronic component-embedded substrate, comprising:
a first core layer having a first through-hole;
a first passive component disposed in the first through-hole;
a second core layer disposed on the first core layer and having a second through-hole;
a second passive component disposed in the second through-hole;
an insulating material covering at least a portion of each of the first passive component and the second passive component and disposed in at least a portion of each of the first through-hole and the second through-hole; and
a conductive structure embedded in the insulating material and disposed between the first passive component and the second passive component,
wherein the first passive component and the second passive component are connected to each other by the conductive structure,
wherein a lower surface of the first core layer and a lower surface of the first passive component are coplanar,
wherein the first passive component includes a plurality of first passive components,
wherein the second passive components includes a plurality of second passive components,
wherein the plurality of first passive components are disposed to be spaced apart from each other in the first through-hole, and
wherein the plurality of second passive components are disposed to be spaced apart from each other in the second through-hole.

18. The electronic component-embedded substrate of claim 17, wherein the insulating material covers a surface of the first core layer, opposing another surface of the first core layer facing the second core layer, and a surface of the second core layer, opposing another surface of the second core layer facing the first core layer, and is disposed in a space between the first core layer and the second core layer.

19. The electronic component-embedded substrate of claim 17, further comprising:
a second wiring layer disposed on the insulating material and connected to the second passive component; and
a third wiring layer disposed on the insulating material and connected to the first passive component.

20. The electronic component-embedded substrate of claim 18, wherein the insulating material includes a first insulating material covering at least a portion of the first passive component, and a second insulating material disposed on the second core layer and covering at least a portion of the second passive component.

21. The electronic component-embedded substrate of claim 19, further comprising:
a first die disposed to be spaced apart from the first passive component in the first through-hole; and
a second die disposed to be spaced apart from the second passive component in the second through-hole,
wherein the second die is connected to the second wiring layer, and
the first die is connected to the third wiring layer.

22. The electronic component-embedded substrate of claim 21, further comprising another conductive structure embedded in the insulating material and disposed between the first die and the second die,
wherein the first die and the second die are connected to each other by the another conductive structure.

* * * * *